United States Patent [19]
Little

[11] 4,402,786
[45] Sep. 6, 1983

[54] ADJUSTABLE HEAT SHIELD ASSEMBLY

[75] Inventor: William Little, Bolton, Mass.

[73] Assignee: Mobil Solar Energy Corporation, Waltham, Mass.

[21] Appl. No.: 298,525

[22] Filed: Sep. 1, 1981

[51] Int. Cl.³ .............................................. C30B 15/34
[52] U.S. Cl. ..................................... 156/608; 422/246
[58] Field of Search ....... 422/246; 156/608, DIG. 73, 156/DIG. 88

[56] References Cited
U.S. PATENT DOCUMENTS 3,845,738 11/1974 Berkman et al. ............ 156/DIG. 73
4,271,129 6/1981 Berkman et al. ..................... 422/246

FOREIGN PATENT DOCUMENTS

2055614 3/1981 United Kingdom ................ 156/608

Primary Examiner—Hiram H. Bernstein
Attorney, Agent, or Firm—Schiller & Pandiscio

[57] ABSTRACT

A novel apparatus is disclosed for use in controlling in a known and predictable manner the temperature of the top surface of a capillary die and the adjacent meniscus during the growth of a crystalline body. The novel apparatus comprises an adjustable heat shield assembly with relatively movable members which can be positioned in such a manner as to provide improved temperature control at the top end of the die which assists in ensuring that a crystalline body grown by means of the capillary die will have a substantially constant cross-sectional size.

18 Claims, 11 Drawing Figures

ADJUSTABLE HEAT SHIELD ASSEMBLY

This invention pertains to the apparatus used during the growth of crystalline material and more particularly to an improved apparatus for controlling the temperature which determines the cross-sectional dimensions of grown crystalline ribbon.

PRIOR ART

There are several techniques that are known for growing crystalline material from a melt. In particular, if the process known as the edge-defined film-fed growth technique (also known as the EFG Process) is used, crystalline bodies having a predetermined shape can be grown. The shape of the crystalline body is determined by the edge configuration of a forming member known as a capillary die. By way of example but not limitation, flat silicon ribbons measuring 0.0015 inch thick by 4 inches wide may be grown from a capillary die having a rectangular edge configuration at its top end. This process is described in greater detail in U.S. Pat. No. 4,118,197.

In the usual EFG mode of operation, the source material, i.e., the material from which the crystalline body is to be grown, is located at the base of a capillary die in molten form. Due to capillary action the melt is drawn up through the capillary in the die to its top surface. A seed crystal is brought into contact with the melt at the top of the die and maintained in this position until a portion of it melts. The molten material extends across the top surface of the capillary die and a meniscus is formed between the seed and the outer edge of the die. As can be appreciated it is necessary that the temperature at the top of the die be above the melting point for the material. As the solidified crystalline material is pulled upward, the molten material in the meniscus is depleted and is replenished by having additional material drawn up through the capillary die from the reservoir containing the molten material. The cross-section of the grown crystalline material is controlled by the height of the meniscus which in turn is controlled by the pulling speed and the temperature of the meniscus. Since it is relatively easy to maintain the pulling speed constant, the usual procedure followed in growing a crystalline body with a substantially constant cross-sectional shape and size is to use a substantially fixed pulling speed (after full size growth has commenced) and to adjust the rate of heating as required to maintain the meniscus temperature at a level which will result in the desired growth. Additionally, and especially when growing silicon ribbon, it is common to employ radiation shields and also, in the case where resistance heaters are used, a multiplicity of face and end heaters for maintaining a proper temperature distribution along the top end surface of the die and the meniscus. However, even with these techniques it is difficult to achieve and maintain an optimum temperature profile along the major horizontal dimension of the meniscus in growing relatively wide silicon ribbons, e.g., ribbons 2-4 inches wide, with the result that the temperature and hence the height of the meniscus may not be the same at the ends of the meniscus corresponding to the narrow side edges of the grown ribbon. This difference may cause the cross-sectional size as well as properties of the growing crystalline ribbon to change.

OBJECTS AND SUMMARY OF THE INVENTION

Accordingly the primary object of the invention is to provide improved apparatus for use in controlling the temperature distribution in the meniscus formed between a capillary die and a growing crystalline body so that the grown body will have a constant predetermined cross-sectional size.

Yet another object of this invention is to provide apparatus for use in controlling the temperature and hence the the liquid meniscus during growth of a crystalline body from a melt supplied by a capillary die.

A further more specific object is to provide an improved means and method for modifying the temperature distribution along the liquid/solid boundary during growth of the ribbon-like crystalline body.

The foregoing and other objects of the present invention are achieved by employing moveable mechanical means for modifying in a precise and reproducible manner the temperature distribution in the growth zone during the growth of a crystalline body while using the EFG process. The mechanical means comprises a heat shield assembly with members which can be moved relative to one another so as to obtain a temperature distribution in the growth zone which assists in ensuring that a growing crystalline body will have a substantially constant cross-sectional size. In its preferred embodiment the heat shield assembly comprises two heat shield members which can be moved independently of each other about a pivot axis perpendicular to the direction of growth. The heat shield assembly is located in close proximity to the top surface of the capillary die and is so fabricated that the heat losses due to radiation and convection arrive at a steady state value. In addition, stabilization of the radiation losses is aided by fabricating the heat shield from a material having a fixed emissivity, e.g., graphite in the case where silicon is being grown.

Other features and specific details of this invention are described in the following description which is to be considered together with the drawings wherein:

Like numerals are used to indicate like parts in the several figures.

According to the present invention the desired temperature distribution is more readily achieved and controlled by the use of an adjustable multi-member heat shield assembly positioned in close proximity to the top of the die. The heat shield assembly provides a thermal environment, in terms of radiation and convection, which affects the temperature distribution along the top surface of the capillary die and the adjacent meniscus. In the preferred embodiment shown in the drawings the heat shield assembly comprises two "D" shaped shields, each of which can be pivoted in a precise manner about an axis perpendicular to the direction of growth and the major horizontal dimension of the die. This pivoting is accomplished by means of two independently movable rods which are attached to and apply a vertical force to the two "D" shields. By pivoting the "D" shields it is possible to modify the temperature gradients in the meniscus and in particular at the width extremities of the meniscus, so as to better achieve and maintain the temperature distribution required for growing a crystalline body of substantially constant cross-sectional size. While the invention is described and illustrated herein as used in the production of silicon ribbon using a furnace with an RF induction heater, it may be adapted for use in growing crystalline bodies of other shapes or materials, e.g., sapphire plate, and also may be used in furnaces using one or more electrical resistance heaters.

Figure 1:
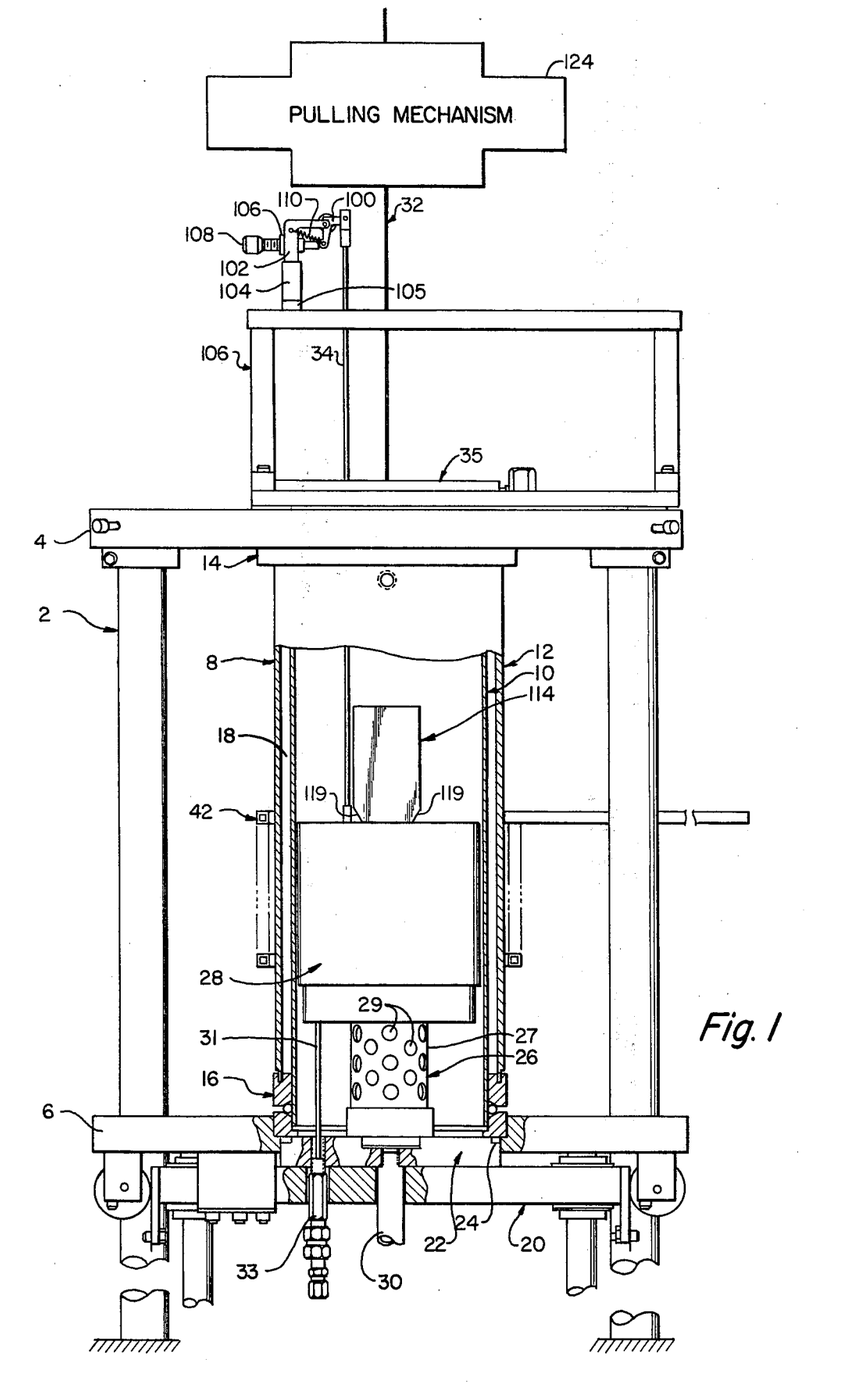
FIG. 1 is a side view in elevation, with certain parts shown in section, of a crystal growing furnace embodying tiltable heat shields constituting a preferred form of the present invention.

Turning now to the drawings, FIG. 1 shows a crystal growing furnace which embodies a preferred form of the invention as applied to the growth of silicon ribbon. The furnace comprises a frame 2 terminating in a header 4 and a base 6, and a furnace enclosure 8 comprising inner and outer walls 10 and 12 terminating in annular top and bottom support assemblies 14 and 16 attached to header 4 and base 6 respectively. Means (not shown) are provided for circulating cooling water through the chamber 18 formed between walls 10 and 12. A platform 20 is arranged for vertical movement toward and away from the underside of base 6. Platform 20 carries a support plate 22 fitted with an annular seal 24 disposed so as to engage and make a tight hermetic seal with the bottom support assembly 16. Affixed to support plate 22 is a pedestal assembly 26 which supports a crystal growing assembly 28 hereinafter described. Pedestal assembly 26 comprises a hollow tube 27 having a plurality of apertures 29. An inert gas is introduced to hollow tube 27 via a conduit 30 carried by support plate 22. The gas flows out of holes 29 around the crystal growing assembly 28 in enclosure 8. A thermocouple assembly 31 is inserted into crystal growing assembly 28 for monitoring the temperature of crucible 38 hereinafter described. Thermocouple assembly 31 is mounted to platform 20 by a tubular assembly 33 through which the thermocouple leads (not shown) are brought out to a suitable temperature indicating means (also not shown). Platform 20 is mounted in the raised position shown in FIG. 1 during crystal growth, but it adopted to be moved down far enough to remove the crystal growth assembly 28 from enclosure 8, so as to facilitate repair or replacement of assembly 28 or any of its parts and also to permit replenishment of the source material in the crucible.

The top support assembly 14 for enclosure 8 is closed off by a plate 35 attached to header 4. Although not shown it is to be understood that plate 35 has three openings, one shaped like but made large enough to slidably accomodate a seed and the crystalline body 32 which is grown on the seed, and the other shaped and sized to slidably accomodate two control rods 34 which form part of the tilt shield mechanism hereinafter described. The openings in plate 35 provide limited clearances for the crystalline body 32 and rods 34 in order to permit limited leakage of inert gas. The inert gas in enclosure 8 is kept at a pressure sufficient to prevent introduction of outside air into the enclosure via its top end.

Figure 2:
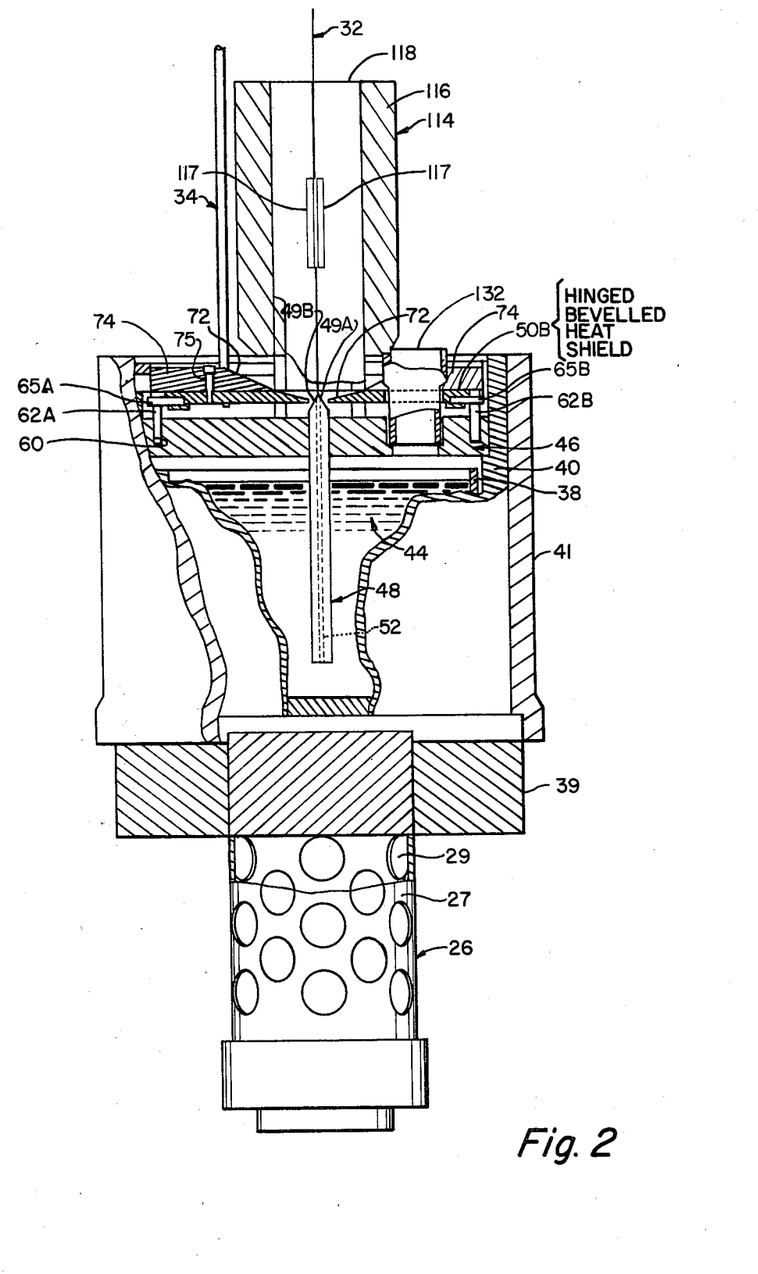
FIG. 2 is an enlarged elevational view, partly in section, of a portion of the apparatus shown in FIG. 1.

Referring now to FIG. 2, the crystal growing assembly 28 comprises a crucible 38 contained in a susceptor 40 and the assembly 28 is supported by a plate 39 forming part of pedestal assembly 26. The susceptor 40 is used as an aid in generating heat from a high frequency induction heater 42 which surrounds furnace enclosure 8 in proximity to the source or feed material contained in the crucible 38. A graphite insulating member 41 surrounds susceptor 40. Supported on a shoulder provided by the susceptor is an annular plate 46 (FIGS. 2 and 3) which serves to support a capillary die 48 and a tilt shield assembly comprising shields 50A and 50B. Die 48 is rectangular in cross-section, is tapered at its upper end as shown at 49A and 49B and includes a capillary 52 which extends from the upper end to the molten source material 44 in the crucible 38. A more specific description of the construction of the die is not believed to be necessary since EFG dies for growing silicon ribbon are well known, as described by U.S. Pat. No. 4,118,197 and 4,184,907.

Figure 3:
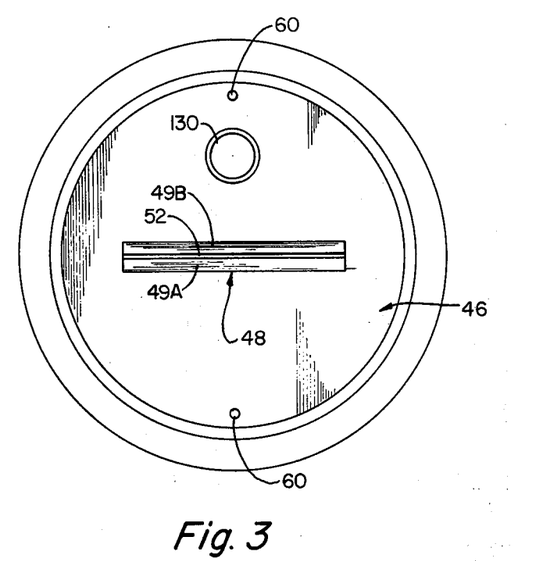
FIG. 3 is a plan view of the die and die support which also serves as a support base for the tiltable heat shields.
Figure 7:
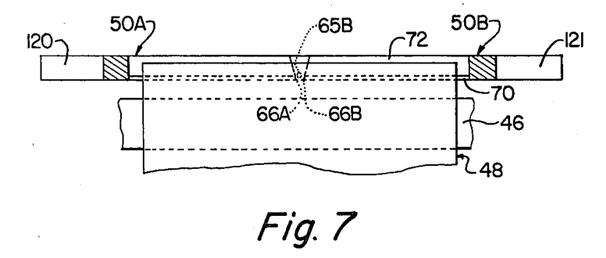
FIG. 7 is a cross-sectional view taken along line 7—7 of FIG. 4.

Referring now to FIGS. 2-5, support plate 46 is provided with two diametrically opposed blind holes 60 sized to receive the bottom ends of two like heat shield support pins 62A and B. The fit between holes 60 and pins 62 is sufficiently precise to maintain the pins perpendicular to the flat upper surface to the flat upper surface of support ring 46. The upper ends of support pins 62A and B are enlarged as shown at 63 and have holes to accommodate pivot pins 65A and B respectively which are used to hold the two heat shields 50A and 50B together. Heat shields 50A and 50B are generally semi-circular in shape, having relatively straight mutually confronting straight edges 66A and B respectively. Additionally heat shields 50A and 50B are formed with relatively thick hinge sections 67A, 67B and 68A, 68B respectively. One pivot pin 65A extends through the hole in support pin 62A and a hole in hinge section 67A into a blind hole in hinge section 68A. The other pivot pin 65B extends through the hole in support pin 62B and a hole in hinge section 68B into a blind hole in hinge section 67B. As a consequence of the hinge connections made by pivot pins 65A and 65B, each heat shield can be pivoted relative to the other so as to allow one or both heat shields to be disposed in a tilted position relative to the plane of support plate 46. The pivot pins 65 are aligned and define a pivot axis which is perpendicular to the length and width of capillary die 48 and parallel to the thickness of the die (for the purpose of this description, the die length is the vertical dimension of the die as seen in FIG. 2, i.e., parallel to the direction of growth, the thickness dimension is the horizontal dimension of the die as seen in FIG. 2; and the width dimension is the horizontal dimension of the die as seen in FIG. 3). As shown in FIGS. 2 and 7, the pivot axis is closed to and preferably slightly below the upper end of die 48, and the thickness of the heat shields is such that when they are horizontal, their upper and lower surfaces are respectively above and below the upper end surface of the die.

Figures 4, 5:
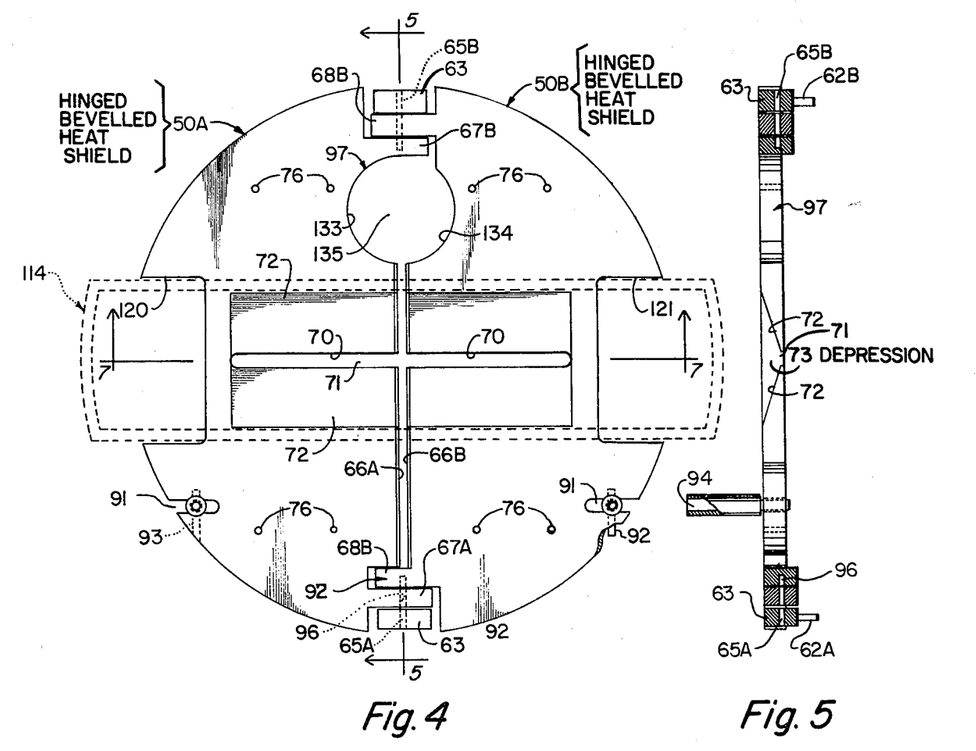
FIG. 4 is a plan view partly in section on a larger scale of the tiltable heat shields.
FIG. 5 is a cross-sectional view of the tiltable heat shields taken along line 5—5 of FIG. 4.

As seen in FIGS. 2 and 4, the shields 50A and B are formed with aligned elongated slots 70 which are formed so as to form an aperture 71 sized to accomodate the tapered upper end of die 48. Aperture 71 is sized so that the shields extend close enough to the tapered surfaces 49A and B (FIG. 3) of the die top end to maximize thermal transfer between it and the die, yet enough clearance is provided to permit tilting of the shields. Additionally, as shown in FIG. 5, each shield 50 is bevelled as shown at 72 on both sides of its slot 70 so that an angular depression 73 is formed in the upper side of the shield assembly around aperture 71. Depression 73 facilitates observation of the top end of the die and the meniscus by the crystal grower.

Attached to the upper side of each heat shield is a layer of an insulating material 74. These layers are bevelled at their edges near aperture 71 so as to form an extension of the taper of depression 73 and thereby facilitate visual inspection of the top end of the die during crystal growth. Insulating layers 74 are secured to the shields by pins 75 (FIG. 2) which are received in holes 76 (FIG. 4).

Pivotal movement of either shield is achieved by applying a force to the shield at a point which does not lie along the pivot axis. Pivotal movement of the shields is accomplished by movement of the two operating rods 34.

The lower ends of rods 34 are pivotally attached to the two heat shields. For this purpose each shield is provided with a slot 91 and the lower ends of rods 34 are threaded and are screwed into couplings 94 which extend into the slots. The latter provide sufficient clearance to allow the couplings to pivot on retaining pins 92 which are inserted in bores 93 formed in the heat shields. The inner ends of bores 93 and the corresponding ends of pins 92 are threaded so as to provide a screw connection. Pins 92 extend through holes in the lower ends of couplings 94 so as to pivotally connect the rods to the heat shields.

Figure 6:
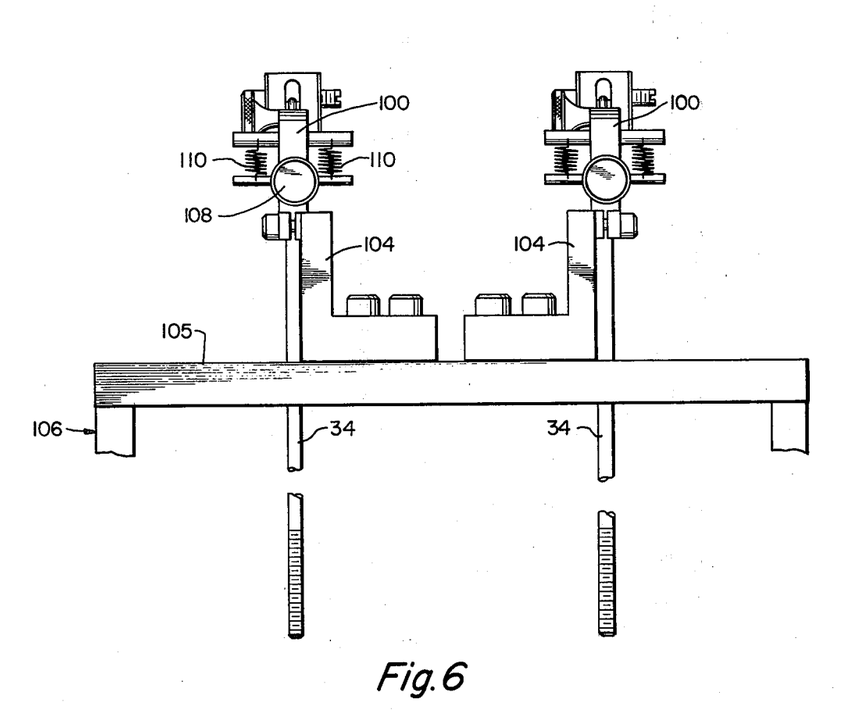
FIG. 6 is an enlarged scale side elevational view of a portion of the apparatus of FIG. 1.

The upper ends of rods 34 are connected to like operating mechanisms of suitable design (see FIGS. 1 and 6). In this case each operating mechanism comprises an L-shaped crank arm 100 which is pivotally mounted between between its ends to a yoke 102. Yoke 102 is attached to a bracket 104 which is secured to a crossmember 105 on a frame 106 attached to the header 4. Yoke 104 supports a micrometer unit consisting of a housing 106 and a threaded shaft 108 screwed into the housing. The forward end of shaft 108 engages the lower end of crank 100. The other end of crank 100 is pivotally connected to the upper end of rod 34. Two springs 110 connected between the lower portion of crank 100 and yoke 104 urge the crank in a clockwise direction, as viewed in FIG. 1. The position of the shaft 108 determines the rest position of crank 100 and thus the position of the associate shield 50A or 50B. When the threaded shaft 108 is screwed into its housing 106, it pivots the crank counterclockwise (as seen in FIG. 1), thus pulling up the rod 34 and thereby causing the attached shield 50A or 50B to tilt, i.e., so as to raise the side of the shield where the rod is attached, while the other side of the shield pivots about the pins 65A and 65B.

The invention is adapted to permit the melt material in the crucible to be replenished without having to remove the die from the crucible. For this purpose support ring 46 is provided with a counterbore hole 130 in which is supported a fill tube 132, and the two mutually confronting portions of heat shields 50A and 50B (and the insulation 74 carried by each shield) are recessed as shown at 133 and 134 so as to form an opening 135 which is located and sized to accommodate fill tube 132 and also allow the heat shields to be tilted to the degree required without any interference from the fill tube.

The apparatus also includes a passive afterheater 114 which may take various forms. In this particular case it is generally rectangular in plan view, having relatively wide sides 116 that extend parallel to the width dimension of the die and relatively narrow ends 118 that extend parallel to the thickness dimension of the die. Afterheater 114 rests on support plate 46 and has openings 119 on opposite sides to permit viewing of the die top. A pair of closely spaced guide plates 117 are attached to the afterheater by suitable means (not shown). The guide plates are symmetrically disposed on opposite sides of the axis of the die and are spaced so as to provide just enough clearance for the growing crystal body 32 to prevent that body from shifting horizontally in a direction perpendicular to the width dimension of the die. Such guidance is necessary to cause the growing ribbon to be straight. It is to be noted that heat shields 50A and B have notches as shown at 120 and 121 which are wider (the vertical dimension in FIG. 4) than the end surfaces 118 of the afterheater. Notches 120 and 121 are symmetrically disposed along the center axis of aperture 71 and function to accommodate portions of afterheater 114 so as to prevent the afterheater from interfering with upward motion of the shields to the degree required for the purposes of the invention. Preferably notches 120 and 121 are sized to allow each heat shield to be tilted up to an angle of at least 30 degrees from the horizontal before being blocked by the afterheater.

Completing the apparatus of FIGS. 1-7 is a pulling mechanism represented generally at 124. Details of the pulling mechanism are not illustrated since the pulling mechanism forms no part of the present invention and various forms of pulling mechanisms may be used. Pulling mechanism 124 may but need not be mounted to and supported by frame 106.

For the growth of silicon ribbon it is advantageous and preferred that the crystal growing assembly 28, and the heat shield assembly including insulation 74 all be made of graphite, while rods 34 and afterheater 114 may be made of molybdenum.

In growing a silicon ribbon with the described apparatus, the afterheater 90 provides a temperature profile such that the thermal stresses in the grown crystalline body 32 are removed. The tilt shields 50 act as heat insulating and susceptor members for the die top. By tilting either one or both heat shields by a small amount (the optimum tilt angle is typically less than 15 to 20 degrees from the horizontal), it is possible to compensate for imbalances in the thermal environment surrounding the upper end of the die, and thereby adjust the temperature gradient along the width dimension of the meniscus which is formed between the upper end of the die and the growing crystalline body. The raising and lowering of the heat shields affects the temperature of the crystalline body at the growth interface and has the affect of causing the meniscus to get smaller or larger along the width dimension of the die. The adjustment afforded by the micrometers 106, 108 allows each tilt shield to be tilted very precisely. Although not shown, it is to be appreciated that members 106 and 108 of each micrometer assembly have cooperating markings graduated in millimeters or thousandths of an inch, as in a conventional micrometer, so as to enable the operator to ascertain and repeat selected angular positions for the two tilt shields. Additionally, the coaction of springs 110 and the micrometer shaft on crank 100 assures that each tilt shields will remain in whatever position it is place once manual rotation of its control shaft 86 has ended.

Figures 8, 9:
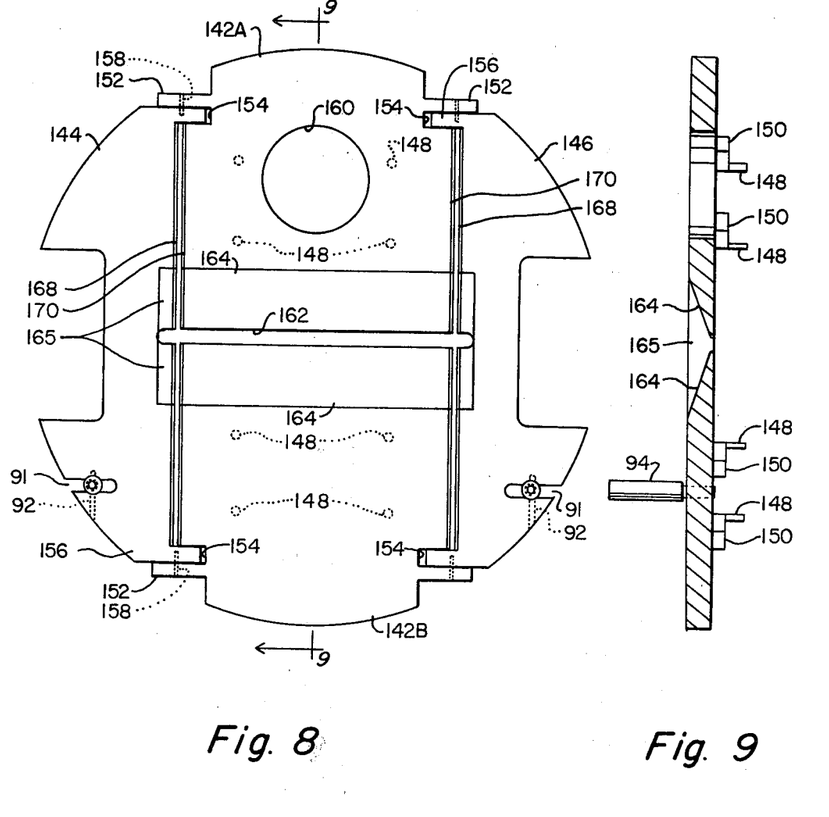
FIG. 8 is a plan view of a second form of heat shield assembly made in accordance with this invention.
FIG. 9 is a cross-sectional view taken along line 9—9 of FIG. 8.

FIGS. 8 and 9 show an alternative form of heat shield assembly constructed in accordance with the present invention. This heat shield assembly consists of four members 142 (A and B), 144 and 146. Heat shield members 142 are provided with support pins 148 which are received in blind holes in the annular plate 46 which supports the die 48. Shoulders 150 may be provided on pins 148 to space the members 142 from the support plate 46 so that their upper and lower surfaces are respectively above and below the level of the upper end surface of the die 48. Heat shield members 142 are formed with hinge sections 152 and slots 154. The heat shield members 144 and 146 are formed with complementary hinge sections 156 which are received in slots 154 and are pivotally secured to hinge sections 152 by means of pivot pins 158. The center member 142A is provided with a circular aperture 160 for accommodating the fill tube 132 (FIG. 2). The four heat shield members 142A, 142B, 144 and 146 form an elongated center aperture 162 sized to accommodate the tapered upper end of die 48. As with the embodiment of FIGS. 1–7, the aperture 162 is sized so that the heat shield members extend close enough to the tapered surfaces 49A and B of the die top end to maximize thermal transfer between them and the die. Additionally, the heat shield members are bevelled as shown at 164 and 165 so that an angular depression 165 is formed in the upper side of those members around the aperture 162. This depression 165 facilitates observation of the top end of the die and the meniscus by the crystal grower.

The heat shield members 144 and 146 are capable of pivotal movement relative to the center member 142, with such pivotal movement being accomplished by means of two operating rods corresponding to the rods 34 of FIGS. 1 and 2. Members 144 and 146 are notched in line with aperture 162 so as to avoid interference by the afterheater 114. The rods 34 are attached to couplings 94 which extend into slots 91 in heat shield members 142 and 146. Couplings 94 are pivotally attached to heat shield members 144 and 146 by retaining pins 92. The upper ends of the rods 34 are connected to like operating mechanisms of suitable design, such as the operating mechanisms illustrated in FIGS. 1 and 6.

With the embodiment illustrated in FIGS. 8 and 9, the center heat shield members 142 are fixed relative to the die, while the heat shield members 144 and 146 may be tilted relative to the center members 142 by adjusting the positions of the operating rods 34. In this embodiment the heat shield members 144 and 146 affect only the extremities of the meniscus. To facilitate the tilting action of the members 144 and 146 relative to the center members 142, the confronting edges of the members may be bevelled as illustrated at 168 and 170.

Figure 10:
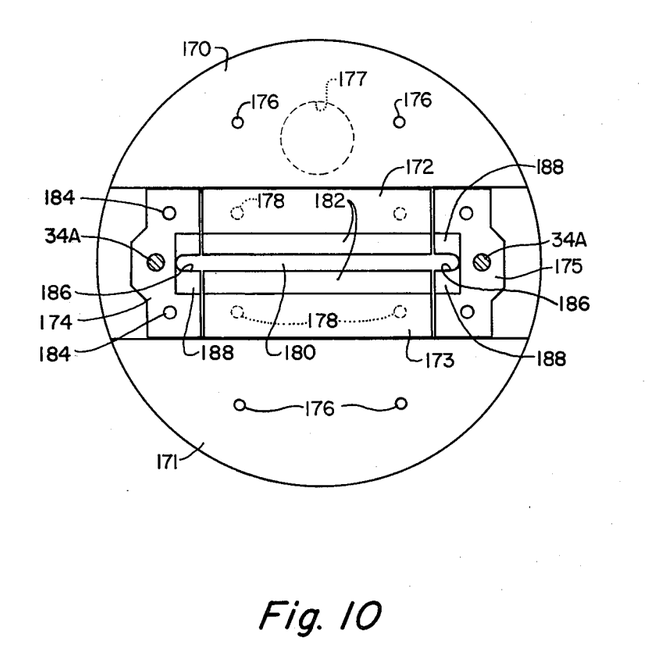
FIG. 10 is a plan view of another form of heat shield assembly made in accordance with this invention.
Figure 11:
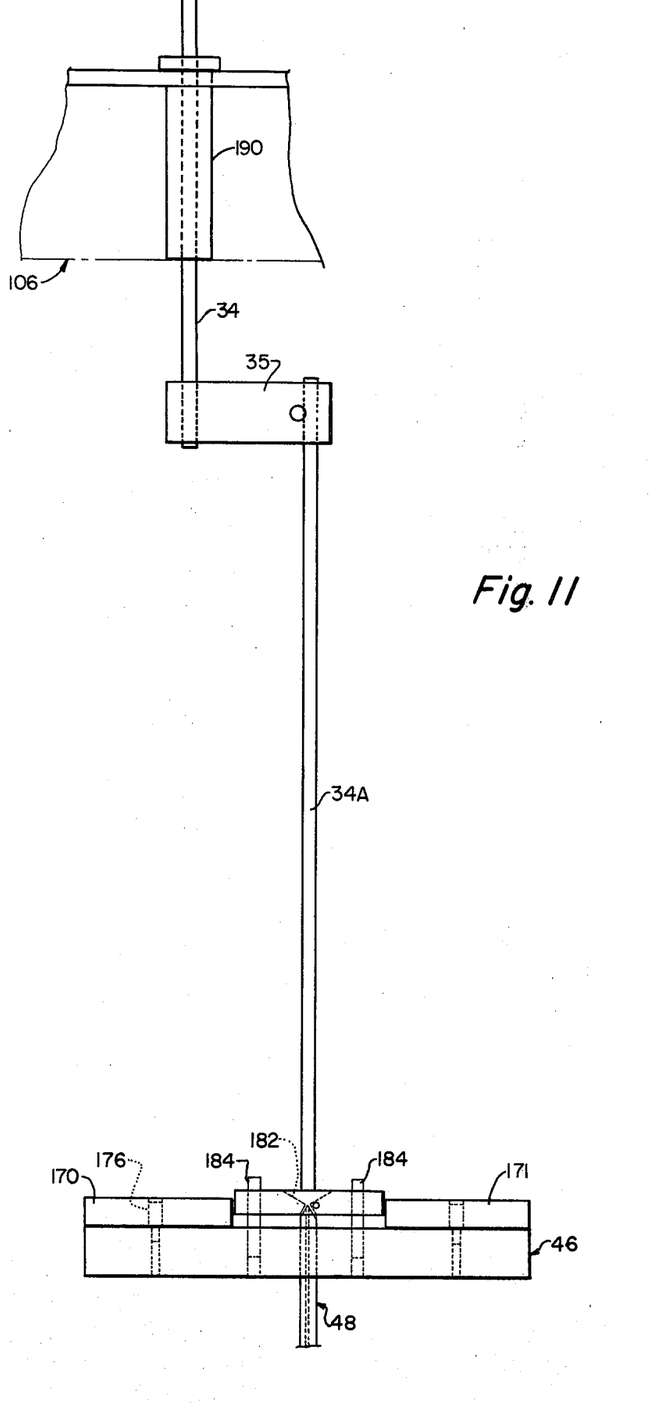
FIG. 11 is a fragmentary view in elevation of the heat shield assembly of FIG. 10 and the mechanism for adjusting that assembly.

FIGS. 10 and 11 illustrate still a further modification of the invention. In this case the heat shield assembly consists of six members, 170, 171, 172, 173, 174 and 175. Members 170 and 171 are supported by the die support plate 46. Each of the members 170 and 171 is provided with locator pins 176 which are received in blind holes in support plate 46. Additionally the heat shield member 170 and support plate 46 may be provided with aligned apertures represented in phantom at 177 for accommodating the fill tube 132. The members 170 and 171 are substantially identical in shape, having a circularly curved outer edge surface.

The members 172 and 173 are disposed along opposite sides of the die and are provided with locator pins 178 which are received in blind holes in the support plate 46 and act to maintain the members 172 and 173 accurately positioned along opposite sides of the die 48. The confronting edges of the members 172 and 173 are spaced from one another so as to define an aperture 180 to accommodate the tapered upper end of the EFG die 48. The confronting edges of the members 172 and 173 are additionally bevelled as shown at 182 so as to facilitate viewing of the top end of the die and the meniscus by the crystal grower.

The members 174 and 175 are provided with apertures sized to slidably accommodate guide pins 184 which are anchored in blind holes in the die support plate 46. Additionally the members 174 and 175 are attached to rods 34A which are offset with respect to but are connected to operating rods 34 by means of connecting members 35. Rods 34 are disposed in guides 190 which are attached to frame 106. Guides 190 allow the rods 34 to move vertically in response to rotation of shaft 108 (FIG. 1). In this embodiment of the invention, the members 174 and 175 do not tilt relative to the other members of the heat shield assembly but instead are merely displaced vertically. Because the members 174 and 175 are formed with notches 186 that serve as extensions of the aperture 180, movement of the members 174 and 175 in a vertical direction has the effect of adjusting the temperature distribution to compensate for imbalances in the thermal environment surrounding the upper end of the die, thereby permitting adjustment of the temperature gradient along the width dimension of the meniscus which is formed between the upper end of the die and the growing crystalline body. Preferably the members 174 and 175 are bevelled as shown at 188 in a manner comparable to the bevels 182, so as to facilitate visual observation of the meniscus by the crystal grower.

This invention is susceptible of other modification. For example, the micrometer adjustment mechanisms and/or the control rods could be replaced by some other form of mechanism providing similar push-pull adjustment of the tilt shields. The invention also may be applied to the growth of crystalline bodies of other cross-sectional shapes, e.g. bodies of elliptical cross-sections, in which case the central apperture in the tilt shields must be modified to conform to the general shape of the upper end of the particular die used for growing the differently shaped body.

Other modifications and advantages of the invention will be obvious to persons skilled in the art.

What is claimed is:

1. Apparatus for growth a crystalline ribbon-like body from a melt comprising:
   a furnace enclosure;
   a crucible located in the furnace for containing a melt,
   means for applying heat to the crucible to maintain the melt,
   a capillary die extending into the crucible such that the melt in the crucible may be supplied to a melt meniscus formed between the capillary die and a growing crystalline body, and a heat shield assembly surrounding the upper end of the capillary die and extending transversely of the die, said heat shield assembly comprising at least two heat shield members arranged for movement relative to one another so that at least a portion of one or more of said heat shield members may be raised or lowered relative to the upper end of said capillary die and the effect of movement of each heat shield member on the thermal gradient around the upper end of the die is greatest at the outer edge of said each heat shield member.

2. Apparatus according to claim 1 wherein the upper end of said die has a rectangular configuration in plan view with a relatively large dimension in one direction and a relatively short dimension in a second direction, and said heat shield assembly comprises two heat shield members mounted for pivotal motion about an axis perpendicular to the vertical axis of said die and perpendicular to said one direction.

3. Apparatus according to claim 1 or 2 further including operating means for pivoting at least one of said heat shield members, said operating means including actuating means located outside of said furnace enclosure.

4. Apparatus according to claim 3 wherein said operating means comprises at least one control rod for transmitting motion from said actuating means to a heat shield member.

5. Apparatus according to claim 4 wherein said actuating member comprises a micrometer screw drive.

6. Apparatus according to claim 4 wherein said heat shield members are made of graphite.

7. Apparatus according to claim 1 wherein said heat shield assembly defines an opening through which the upper end of the capillary die extends.

8. Apparatus according to claim 7 wherein the top end of said capillary die has a rectangular cross-section and the opening defined by said heat shield assembly is shaped so that said heat shield assembly extends close to the outer surfaces of the die at said top end for substantially the full breadth of said surfaces.

9. Apparatus according to claim 8 wherein at least two of said heat shield members are shaped so as to provide a depression therein surrounding said opening.

10. Apparatus according to claim 1 wherein said capillary die is shaped such that said crystalline body has a ribbon like shape.

11. Apparatus according to claim 1 wherein said heat shield assembly consists of two heat shield members hinged to one another.

12. Apparatus according to claim 1 wherein said heat shield assembly comprises a first stationary heat shield member and second and third heat shield members, said second and third heat shield members being mounted for pivotal movement relative to said first heat shield member about separate axes each extending at a right angle to the vertical axis of said die, and further including means for selectively moving said second and third heat shield members relative to said first heat shield member.

13. In a method of growing a ribbon shaped crystalline body from a melt supplied by a capillary die, the improvement comprising surrounding the top of the capillary die with a heat shield assembly comprising at least two heat shield members and means mounting said at least two heat shield members for pivotal movement about an axis extending at a right angle to the vertical axis of said die, and adjusting the temperature distribution at the upper end of said die during growth of said body by pivoting selected ones of said heat shield members so that the effect of movement of said selected heat shield members on the thermal gradient surrounding the upper end of said die is greatest at the outer edge of said selected heat shield members.

14. A method according to claim 13 wherein said heat shield assembly consists of two heat shield members hinged to one another, and said heat shield members are moved by pivoting them about their hinge axis.

15. Apparatus according to claim 1 further including a passive afterheater for said ribbon like body mounted above but close to said heat shield assembly.

16. Apparatus according to claim 1 wherein said heat shield assembly has an aperture through which the upper end of said die extends, and further including an angular depression in the upper side of said heat shield assembly surrounding said aperture.

17. Apparatus according to claim 16 wherein said heat shield has a circular periphery.

18. Apparatus according to claim 3 wherein said actuating means is disposed above said heat shield assembly.

* * * * *

UNITED STATES PATENT AND TRADEMARK OFFICE
CERTIFICATE OF CORRECTION

PATENT NO. : 4,402,786
DATED : September 6, 1983
INVENTOR(S) : William Little

It is certified that error appears in the above-identified patent and that said Letters Patent is hereby corrected as shown below:

Claim 1, column 8, line 60, the word "growth" should be -- growing --,

Signed and Sealed this

First Day of November 1983

[SEAL]

Attest:

GERALD J. MOSSINGHOFF

Attesting Officer — Commissioner of Patents and Trademarks